United States Patent [19]
Park

[11] Patent Number: 5,697,658
[45] Date of Patent: Dec. 16, 1997

[54] CENTERING APPARATUS FOR COMPONENT MOUNTING DEVICE

[75] Inventor: Jun-ok Park, Suwon, Rep. of Korea

[73] Assignee: Samsung Electronics Co., Ltd., Suwon, Rep. of Korea

[21] Appl. No.: 435,038

[22] Filed: May 5, 1995

[51] Int. Cl.$^6$ .............................. B65G 47/91; H05K 3/30
[52] U.S. Cl. .................. 294/64.1; 294/2; 294/119.1; 29/743
[58] Field of Search .................... 294/2, 64.1, 65, 294/119.1; 29/740, 743; 901/36, 40

[56] References Cited

U.S. PATENT DOCUMENTS

| | | | |
|---|---|---|---|
| 4,473,247 | 9/1984 | Itemadani et al. | 294/2 |
| 4,515,507 | 5/1985 | Asai et al. | 294/2 |
| 4,610,473 | 9/1986 | Hawkswell | 294/2 |
| 4,753,004 | 6/1988 | Fujioka | 294/2 |
| 4,796,357 | 1/1989 | Smith | 294/2 |
| 5,056,844 | 10/1991 | Takabayashi | 294/2 |
| 5,106,138 | 4/1992 | Lawson | 294/2 |

*Primary Examiner*—Dean Kramer
*Attorney, Agent, or Firm*—Burns, Doane, Swecker & Mathis, LLP

[57] ABSTRACT

A mechanism for picking up and centering a component which is to be placed on an object includes a suction nozzle for holding the component. A first actuator moves the suction nozzle vertically to position the component at a preselected height relative to centering fingers of the mechanism. A second actuator moves the centering fingers horizontally toward the component to center the component being held by the nozzle. A third actuator rotates the suction nozzle (and component) about a vertical axis. The fingers may form vertically spaced component-engaging zones of different shape (e.g., different width and/or thickness) for receiving components of correspondingly different shapes.

15 Claims, 4 Drawing Sheets

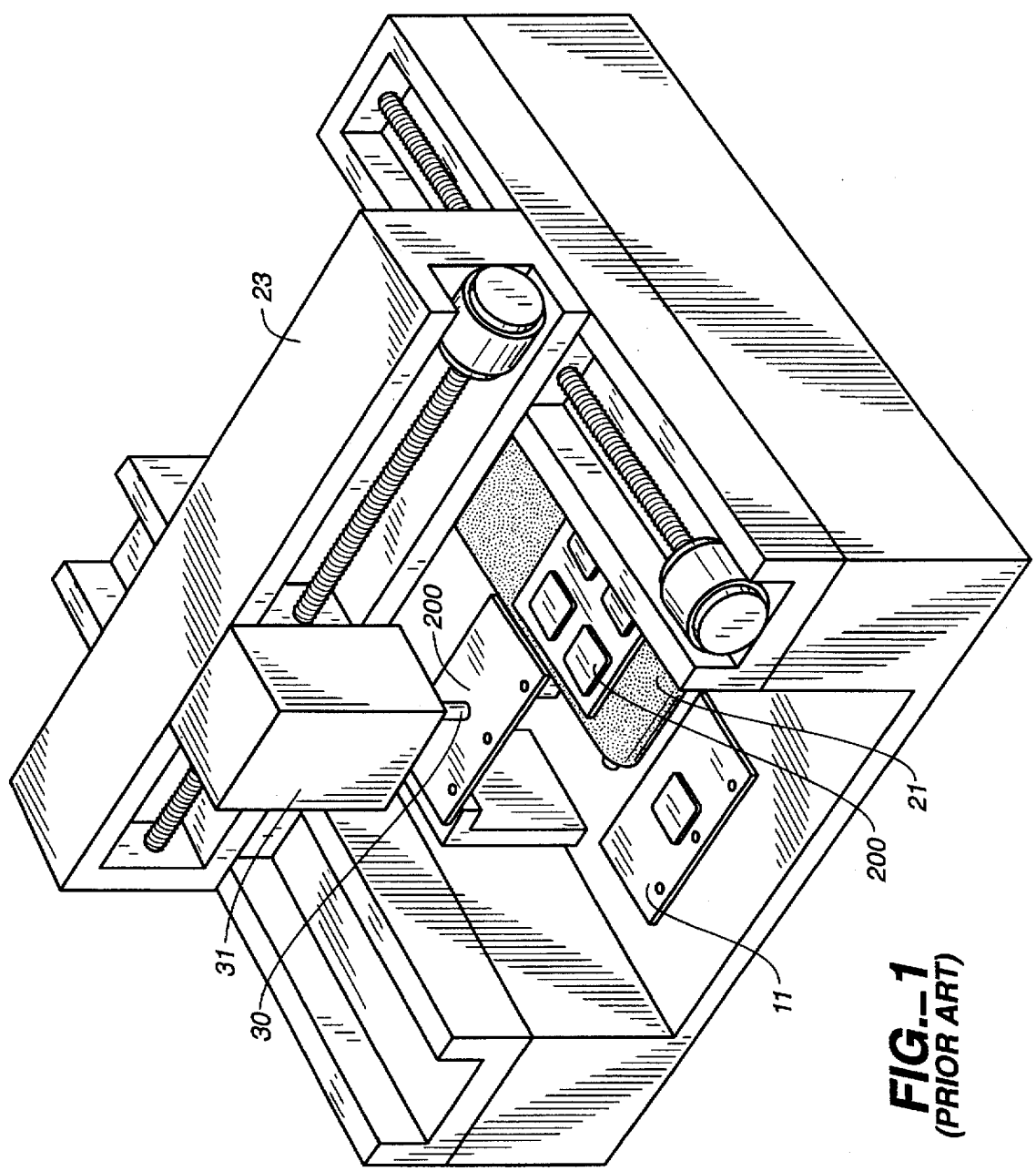
FIG._1
(PRIOR ART)

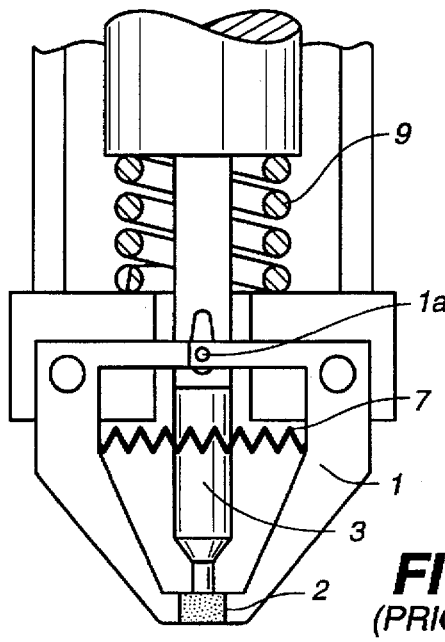
FIG._2
*(PRIOR ART)*
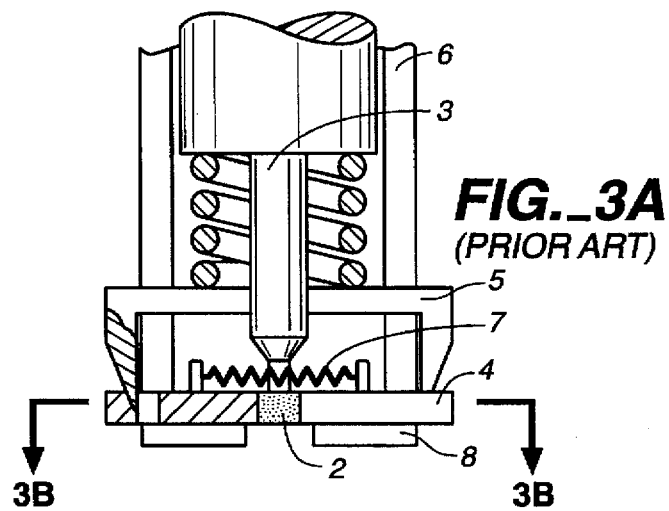
FIG._3A
*(PRIOR ART)*
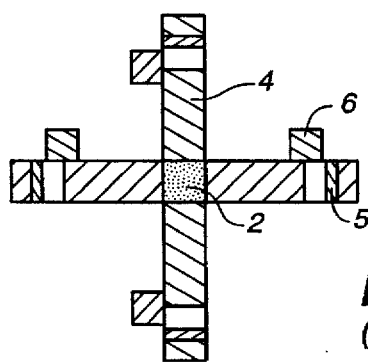
FIG._3B
*(PRIOR ART)*

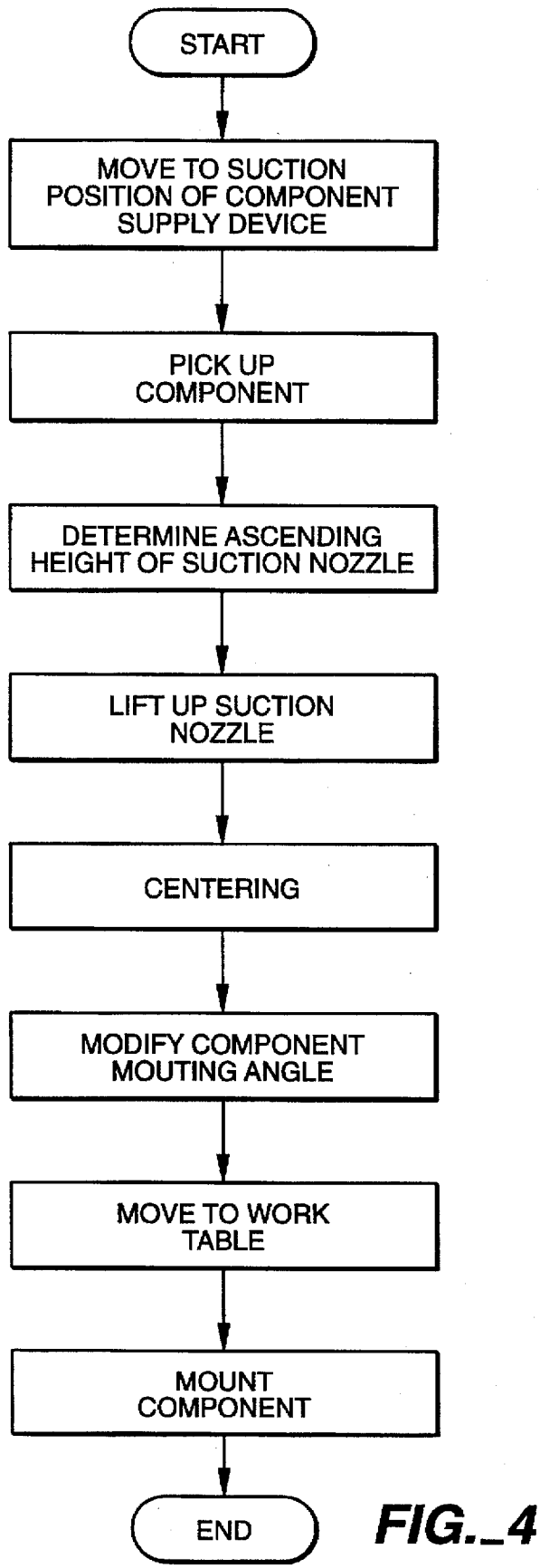
FIG._4

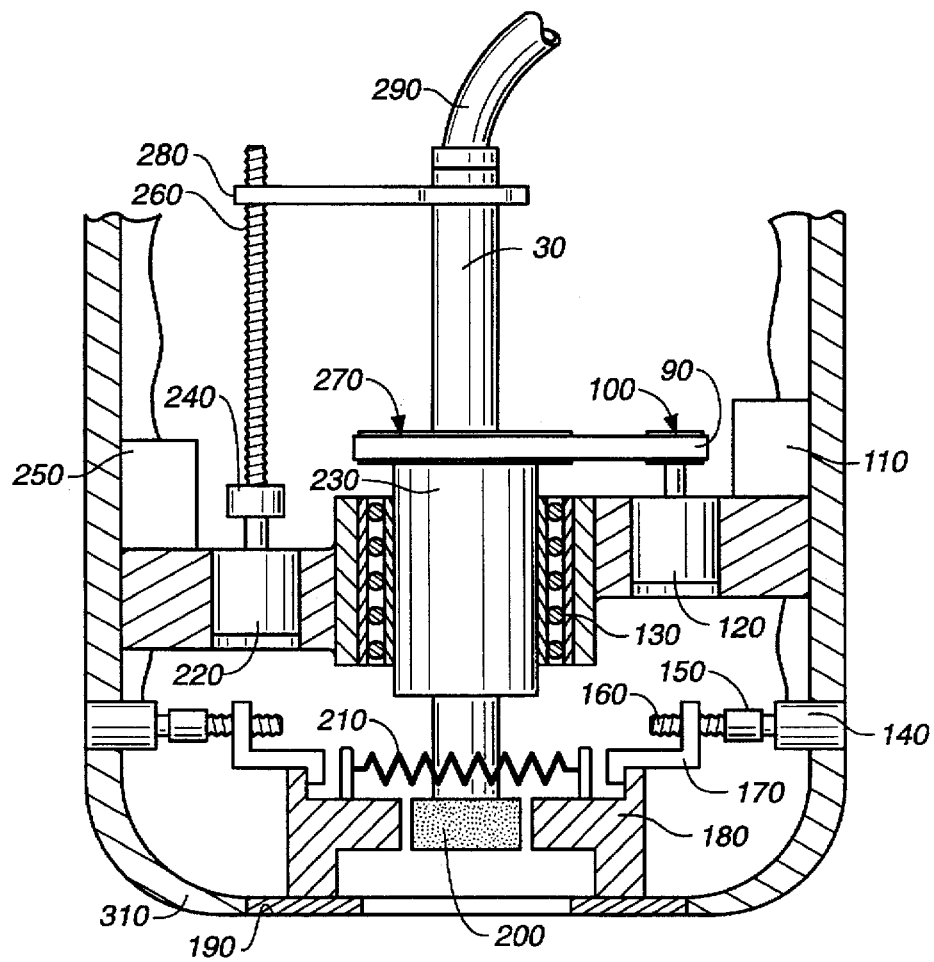
FIG._5
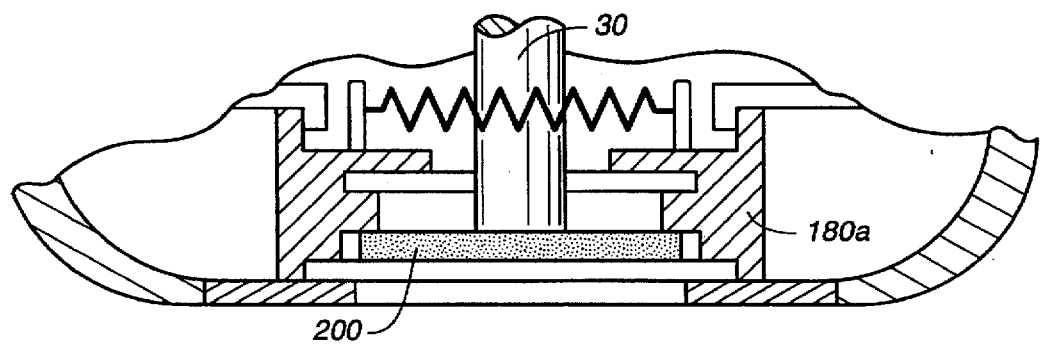
FIG._6

CENTERING APPARATUS FOR COMPONENT MOUNTING DEVICE

BACKGROUND OF THE INVENTION

The present invention relates to a component mounting device, and more particularly, to an apparatus for centering a component held by a suction device on the relevant position on a circuit board in order to precisely mount the component on the corresponding position.

Generally, the assembly of an electronic product is performed through a process of mounting the relevant component in a predetermined component-mounting position on a printed circuit board (PCB), brazing the thus-mounted component. Referring to FIG. 1, in an automatic component mounting device, in order to mount component 200 in a precise position in circuit board 11 (the object to be worked), the component 200 is picked up from component supply device 21, using suction nozzle 30 of a mounting device 31 fixed to robot arm 23. The center of the component is centered on suction nozzle 30 and is mounted by moving the center of the component to the center of the component-mounting position on the circuit board.

FIGS. 2, 3A and 3B each show a robot (specifically, a robot arm) for mounting a component in a relevant position on a printed circuit board. First, referring to FIG. 2, suction nozzle 3 is installed on the center of a robot arm four pivotally mounted fingers finger 1 in four directions. Spring 7 is fixed between the fingers which face each other to bias the fingers closed. The fingers are open when suction nozzle 3 descends. Meanwhile, fingers 1 close when suction nozzle 3 ascends, where upon the component 2 becomes centered on suction nozzle 3. Here, the open and closing action of the fingers 1 is performed by the interaction between spring 9, finger fixing pin 1a and compression spring 7 according to the descending and rising of suction nozzle 3.

However, the aforesaid component-picking-up device having such fingers 1 requires the suction nozzle 3 to be shaped according to the shape and thickness of a component. Therefore, the suction nozzle must be exchanged according to the shape and thickness of a component, so there has been decreased productivity according to the increased time for the exchange of a suction nozzle.

In another conventional example, as shown in FIGS. 3A and 3B, suction nozzle 3 is fixed to the center of a robot arm, and four fingers 4 are arranged to reciprocate on the feet 8 of respective guides 6, opposing ones of the fingers 4 being biased together by a spring 7. A member 5 attached to the suction nozzle 3 includes camming legs which force the fingers 4 to an open position when the nozzle 3 decends. In operation, when suction nozzle 3 descends and picks up a component, member 5 descends to cause fingers 4 guided by guider 8 to be horizontally open. On the other hand, when suction nozzle 3 has picked up a component and ascends, member 5 ascends, where upon fingers 4 are closed by the tension of spring 7 so that component 2 becomes centered.

As described above, the device of FIGS. 3A and 3B by and large improved the problem of requiring lots of suction nozzles in quantity compared with the device shown in FIG. 2 However, the fingers 4 still need to be exchanged according to the kinds and size of component 2 to be held.

SUMMARY OF THE INVENTION

To solve the above problems, it is an object of the present invention to provide a centering apparatus for a component mounting device, by which the number and type of suction nozzles needed for mounting components of different thicknesses are minimized so that the required time for the change of the suction nozzle is reduced.

Accordingly, to achieve the above object, there is provided a centering apparatus for a component mounting device, comprising: a suction nozzle for picking up and holding a component arranged at the center of a base frame; means for ascending and descending the suction nozzle mounted on the base frame; means for centering the component picked up and held by the suction nozzle mounted on the base frame on the lower side of the suction nozzle; and means for adjusting a mounting angle of the component picked up by rotating the suction nozzle.

BRIEF DESCRIPTION OF THE DRAWINGS

The above objects and advantages of the present invention will be more apparent by describing in detail a preferred embodiment thereof with reference to the attached drawings in which:

FIG. 1 is a top perspective view schematically illustrating the structure of an automatic component-mounting system;

FIG. 2 is a view schematically illustrating a conventional centering apparatus having fingers which move following a circular arc;

FIG. 3A is another view schematically illustrating a conventional centering apparatus having fingers which move horizontally in opening and closing, and FIG. 3B is a cross section view taken along line 3A—3A in FIG. 3A;

FIG. 4 is a flowchart illustrating a centering operation according to the present invention;

FIG. 5 is a vertical cross-sectional view illustrating a centering apparatus in a component-mounting device according to the present invention; and FIG. 6 is a fragmentary vertical cross-sectional view illustrating another centering apparatus in a component-mounting device according to the present invention.

DETAILED DESCRIPTION OF THE PREFERRED EMBODIMENTS OF THE INVENTION

Referring to FIG. 5, on the upper side of suction nozzle 30 arranged at the center of a component mounting device, one side of first feed bracket 280 is mounted, and the other side of the first feed bracket is linked by second coupling 240 to a second threaded rod 260 installed in parallel with suction nozzle 30. Second threaded rod 260 is linked to third motor 220 mounted a base frame 310. Thus, second threaded rod 260 is rotated by third motor 220, and suction nozzle 30 can be moved up and down thereby.

At the middle of suction nozzle 30, support 230 supporting the suction nozzle is arranged. The support is arranged on base frame 310 and splinted with the suction nozzle, and supporting bearing 130 is provided between the support 230 and the base frame. Accordingly, the suction nozzle can be movable up and down and rotatable together with the support 230.

Belt pulley 270 fixed to the upper side of support 230, is linked by belt 90 to motor pulley 100 of first motor 120 mounted on the base frame 310. Thus, as suction nozzle 30, mounts component 200 on a board, a mounting angle of the component can be adjusted by the rotation of first motor 120.

Mounted lower on base frame 310, is second motor 140 which rotates first threaded rod 160 to horizontally move second feed bracket 170. One end of the rod 160 is linked to second motor 140 via first coupling 150, and the other end is connected to one end of feed bracket 170.

The other end of second feed bracket 170 is hooked around finger 180 which is guided for sliding movement slide on 190 toward in a central axis of the mounting device. There are provided four fingers 180 arranged at right angles and projecting radially from the center axis. Two tension springs 210 (only one shown) arranged at right angles are provided. Both ends of each tension spring 210 are fixed to two opposing ones of the fingers. Thus, finger 180 retreats from the central axis of the mounting device when second feed bracket 170 is drawn back by screw 160. On the other hand, by feed bracket 170 being advanced by the rotation of screw 160, the finger approaches the central axis of the mounting device so that component 200 can be centered by the tension of springs 210 arranged between opposing fingers.

Third motor 220 is linked to second motor adjuster 250 mounted on base frame 310, and second motor adjuster 250 is associated with a CPU (not shown) provided with a component list. Also, both first and second motors 120 and 140 are linked to first motor adjuster 110 which is associated with the CPU.

Referring to FIGS. 1, 4 and 5, component mounting device 31 moves to the suction position of a component supply device. When suction nozzle 30 ascends after descending and picking up component 200 to be mounted, the information of a component in the component list is delivered to motor adjuster 250 by the CPU, and the ascension height of suction nozzle 30 is determined accordingly. When suction nozzle 30 completes its ascending, second motor 140 linked to finger 180 starts to rotate and second feed bracket 170 advances in the direction of the central axis sufficiently far so that springs 210 between fingers 180 can center component 200.

After the component-centering is completed, suction nozzle 30 shifts to a circuit board 11 of a work table. During the shift, the suction nozzle is rotated to a component-mounting angle by first motor 120 receiving information from its CPU provided with the component list, so that the centered component 200 is mounted on the circuit board 11.

FIG. 6 shows another embodiment of a centering apparatus for a component mounting device according to the present invention. As shown in the drawing, the size and shape of a component is determined according to the purpose of a work place, and, after measuring the various diameters and thicknesses according to the determined shape of the component, a finger 180a is fabricated and installed. That is, a plurality of steps S1, S2, S3 corresponding to components of various form are made on finger 180a. Therefore, the ascension height of suction nozzle 30 is determined by the CPU according to the diameter and thickness of a component to be picked up, so that an appropriate step among the plurality of steps S1, S2, S3 formed on a finger is selected and a component is centered.

In the present invention, a motor and screw is described as height-adjusting means for adjusting the height of a suction nozzle and horizontal opening/closing means for a finger. However, an actuator using fluid can also be employed.

As described above, a centering apparatus for a component mounting device has an effect of reducing cost by minimizing the number of suction nozzles required to correspond to the various shapes of a component. Also, the centering apparatus can reduce the producing time of a product by centering various components with fingers and minimizing the time for the exchange of the suction nozzle and the finger.

What is claimed is:

1. A centering apparatus for a component mounting device, comprising:

a suction nozzle for picking up and holding a component, and arranged at the center of a base frame;

means for ascending and descending said suction nozzle mounted on said base frame, wherein said ascending and descending means comprises a threaded rod fixed in parallel with said suction nozzle, a driving source for supporting and rotating said threaded rod and mounted on said base frame, and a bracket linked to said threaded rod and of which one side is fixed to the upper side of said suction nozzle;

means for centering the component picked up and held by said suction nozzle mounted on the base frame which is at the lower side of said suction nozzle; and means for adjusting a mounting angle of a component picked up by rotating said suction nozzle, wherein said adjusting means is mounted on said base frame.

2. A centering apparatus for a component mounting device, comprising:

a suction nozzle for picking up and holding a component, and arranged at the center of a base frame;

means for adjusting a mounting angle of a component picked up by rotating said suction nozzle, wherein said adjusting means is mounted on said base frame, means for ascending and descending said suction nozzle mounted on said base frame, wherein said ascending and descending means comprises an actuator fixed to the base frame at a first end adjacent to the adjusting means and in parallel with said suction nozzle, and a bracket linked to a second end of said actuator and one side of which is fixed to the upper side of said suction nozzle;

means for centering the component picked up and held by said suction nozzle mounted on the base frame which is at the lower side of said suction nozzle.

3. A centering apparatus for a component mounting device in claim 2, wherein said adjusting means is mounted on said base frame, wherein said angle adjusting means comprises a support linked rotatably to said base frame and said suction nozzle, and rotating means for rotating said support, said rotating means being mounted on said base frame, wherein said rotating means comprises a belt pulley mounted on said support, a motor mounted on said base frame, a motor pulley fixed to the axis of said motor, and a belt linked to said belt pulley and said motor pulley.

4. A centering apparatus for a component mounting device, comprising:

a suction nozzle for picking up and holding a component, and arranged at the center of a base frame;

means for ascending and descending said suction nozzle mounted on said base frame;

means for centering the component picked up and held by said suction nozzle mounted on the base frame which is at the lower side of said suction nozzle, wherein said centering means comprises a finger advancing and retreating to and from a central axis of said suction nozzle at the lower side of said base frame, an elastic member for shifting said finger to the central axis and both ends of which are fixed respectively to opposing pairs of said fingers, an actuator fixed to the base frame in the shifting direction of each finger, and a bracket of which one side is hooked around said finger and of which other side is linked to said actuator; and means for adjusting a mounting angle of a component picked up by rotating said suction nozzle wherein said adjusting means is mounted on said base frame.

5. A centering apparatus for a component mounting device, comprising:

a suction nozzle for picking up and holding a component, and arranged at the center of a base frame;

means for ascending and descending said suction nozzle mounted on said base frame;

means for centering the component picked up and held by said suction nozzle mounted on the base frame which is at the lower side of said suction nozzle, wherein said centering means comprises a finger advancing and retreating to and from a central axis of said suction nozzle at the lower side of said base frame, an elastic member for shifting said finger to the central axis and fixed respectively to opposing pairs of said fingers, a bracket of which one side is hooked around said finger and of which other side is linked to a threaded rod, and a driving source for supporting and rotating said threaded rod and mounted on said base frame; and means for adjusting a mounting angle of a component picked up by rotating said suction nozzle wherein said adjusting means is mounted on said base frame.

6. A centering apparatus for a component mounting device described in claim 5, wherein a plurality of steps corresponding to the various shapes of a component is formed on said finger.

7. A centering apparatus for mounting components on an object, comprising:

a base frame;

a suction nozzle for gripping a component, said suction nozzle mounted on said base frame for up and down movement relative thereto and for rotation relative thereto about a vertical axis;

a centering mechanism mounted on said base frame and arranged for centering a component held by said suction nozzle;

a first adjusting mechanism mounted on said base frame and connected to said suction nozzle for raising and lowering said suction nozzle relative to said base frame to orient the component at a selected height relative to said centering mechanism wherein the first adjusting mechanism comprises a threaded rod extending parallel to said suction nozzle, a drive device for supporting and rotating said rod, and a bracket connected to said rod and said suction nozzle for raising and lowering said suction nozzle in response to rotation of said rod; and a second adjusting mechanism mounted on said base frame and connected to said suction nozzle for rotating said suction nozzle relative to said base frame about said vertical axis.

8. The centering apparatus according to claim 7 wherein said centering mechanism comprises fingers mounted on said base frame adjacent a lower end thereof, said fingers being movable toward and away from said axis; an elastic member connected to opposing ones of said fingers for biasing said fingers toward said axis, actuators connected to respective fingers for pulling said fingers away from said axis against the bias of said elastic member.

9. The centering apparatus according to claim 8 wherein each actuator includes a link which has a hook at one end thereof, said hook being engaged with a respective finger.

10. The centering apparatus according to claim 9 wherein said actuators further include motors connected to respective brackets.

11. The centering apparatus according to claim 7 wherein said centering mechanism comprises fingers mounted on said base frame adjacent a lower end thereof for movement toward and away from said axis; elastic members fixed to opposing ones of said fingers for biasing said fingers toward said axis; brackets each having first and second sides, said first side hung on a respective finger; threaded rods each connected to said second side of a respective bracket; and driving devices connected to respective rods for rotating said rods to displace said brackets.

12. The centering apparatus according to claim 11 wherein each finger includes an end for engaging a component, said end of said finger including vertically spaced zones of different shapes for receiving correspondingly shaped components.

13. The centering apparatus according to claim 7 wherein said centering mechanism includes a plurality of fingers movable toward and away from said axis; each finger having a component-engaging end; said end including vertically spaced zones of different shapes for receiving correspondingly shaped components.

14. The centering apparatus according to claim 7 wherein said second adjusting mechanism comprises a bearing mounted to said base frame, said suction nozzle mounted in said bearing for rotation about said axis; said suction nozzle being movable vertically relative to said bearing.

15. The centering apparatus according to claim 14 wherein the second adjusting mechanism further includes a support rotatably mounted in said bearing; a motor arranged to rotate said support along with said suction nozzle; said suction nozzle connected to said support by vertical splines to permit said suction nozzle to move vertically relative to said support.

* * * * *